(12) United States Patent
Ahmed et al.

(10) Patent No.: US 7,446,694 B1
(45) Date of Patent: Nov. 4, 2008

(54) SYSTEM FOR SYNCHRONIZATION OF MULTI-SENSOR DATA

(75) Inventors: Mohamed I. Ahmed, Glendale Heights, IL (US); Faisal Ishtiaq, Chicago, IL (US); Magdi A. Mohamed, Schaumburg, IL (US); Irfan Nasir, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/755,341

(22) Filed: May 30, 2007

(51) Int. Cl.
*H03M 1/36* (2006.01)

(52) U.S. Cl. .................. 341/160; 348/321; 348/294; 250/237 G; 382/313; 345/173; 345/156; 399/21

(58) Field of Classification Search .......... 341/140–170
See application file for complete search history.

(56) References Cited

U.S. PATENT DOCUMENTS

| | | | | |
|---|---|---|---|---|
| 4,263,621 A | * | 4/1981 | Berke | 348/294 |
| 4,937,445 A | * | 6/1990 | Leong et al. | 250/237 G |
| RE34,749 E | * | 10/1994 | Leong et al. | 250/237 G |
| 5,388,126 A | | 2/1995 | Rypinski et al. | |
| 5,479,240 A | * | 12/1995 | Lee et al. | 399/21 |
| 5,523,788 A | * | 6/1996 | Kannegundla et al. | 348/321 |
| 5,734,624 A | | 3/1998 | Schmidt et al. | |
| 6,108,462 A | * | 8/2000 | Aoki et al. | 382/313 |
| 6,154,167 A | * | 11/2000 | Annan et al. | 342/22 |
| 6,573,918 B2 | * | 6/2003 | Kobayashi et al. | 347/115 |
| 6,704,035 B2 | * | 3/2004 | Kobayashi et al. | 347/116 |
| 7,000,598 B2 | * | 2/2006 | Sheikh et al. | 123/476 |
| 7,196,689 B2 | * | 3/2007 | Moriyama | 345/156 |
| 7,298,365 B2 | * | 11/2007 | Moriyama | 345/173 |
| 2002/0114890 A1 | * | 8/2002 | Posey et al. | 427/385.5 |
| 2005/0066101 A1 | * | 3/2005 | Fuehrer et al. | 710/300 |
| 2006/0120477 A1 | * | 6/2006 | Shen et al. | 375/267 |

OTHER PUBLICATIONS

Paul Ekas, FPGAs rapidly replacing high-performance DSP capability, Altera Corporation, Feb. 2007.

* cited by examiner

*Primary Examiner*—Lam T Mai

(57) ABSTRACT

A multi-sensor system includes a first analog sensor sub-system, a second analog sensor sub-system, and a system for synchronizing the outputs of the first and second analog sub-systems. Each analog sensor sub-system includes a sensor that produces an analog output. Each sensor is coupled to analog circuitry that processes the output from the sensor. The system for synchronizing the outputs of the first and second analog sensor sub-systems simultaneously inserts a marker into the outputs of the first and second analog sensors. Then, the outputs of the analog circuitry of the first and second analog sub-systems are synchronized based upon the marker. The marker signal may be produced using a Barker sequence signal generator.

25 Claims, 7 Drawing Sheets

FIG. 1 —PRIOR ART—

SYSTEM FOR SYNCHRONIZATION OF MULTI-SENSOR DATA

BACKGROUND OF THE INVENTION

The present invention relates generally to the field of sensor systems. More particularly, the present invention relates to a system for synchronizing the outputs of multiple analog sensors.

In many fields, multiple sensor systems are used to obtain better data or to provide new types of measurements. For example, in the medical field, the quality of heart rate data from a heart rate monitor may be improved by using data from other sensors, such as accelerometers or gyroscopic sensors, to remove motion artifacts that may affect the heart rate data. Another example is sensing the amount of pressure applied to a foot when a knee is bent. The data from pressure sensors on the foot may be combined with data from accelerometers around the knee. One more situation may occur even when dealing with single-modality sensors as well. For example, pressure sensors placed on the foot may have different designs than pressure sensors placed on an arm or a head band due to the expected range of pressure values.

In order to be useful, the data from the multiple sensors must be synchronized for analysis. Data from current multi-sensor systems may not be synchronized on account of differing latencies in the electronics of the various sensors in the analog domain. Different types of sensors use different electronic circuits to produce their outputs depending on their modality (e.g., pressure, sound, image, olfactory, temperature, etc.) and other characteristics (e.g., data rates, range of values, resolution of measurements, etc.). Thus, events that are detected by the sensors at the same time may not be output by the electronics of the respective sensors at the same time.

SUMMARY OF THE INVENTION

Embodiments of the present invention provide multi-sensor systems. One embodiment of the present invention provides a first analog sensor sub-system, a second analog sensor sub-system, and a system for synchronizing the digitized outputs of the first and second analog sub-systems. Each analog sensor sub-system includes a sensor that produces an analog output. Each sensor is coupled to analog circuitry that processes the output from the sensor. The system for synchronizing the outputs of the first and second analog sensor sub-systems simultaneously inserts a marker into the outputs of the first and second analog sensors. Then, the outputs of the analog circuitry of the first and second analog sub-systems are synchronized based upon the marker.

Each analog sensor sub-system includes an analog multiplexer coupled between the analog sensor and the analog circuitry. A marker signal generator is coupled to the analog multiplexers of the first and second analog sub-systems. The marker signal generator may include a digital signal generator and a digital-to-analog (D/A) converter coupled between the digital signal generator and the analog multiplexers of the first and second analog sensor sub-systems. The digital signal generator may include a Barker sequence generator. Each analog sensor sub-system includes an analog-to-digital (A/D) converter coupled to the output of the analog circuitry. The A/D converter digitizes the output of the analog circuitry associated with a sensor.

An embodiment of a system for synchronizing the digitized outputs of the first and second analog sensor sub-systems includes a first buffer coupled to the analog-to-digital converter of the first analog sensor sub-system and a second buffer coupled to the analog-to-digital converter of the second analog sensor sub-system. A first correlation device is coupled to the first buffer and a second correlation device is coupled to the second buffer. The correlation devices may include cross-correlators or auto-correlators. Peak detectors are coupled to the respective first and second correlation devices. The peak detectors detect the markers that have been multiplexed with the output signals of the analog sensors. A delta T calculation and address generation unit is coupled between the peak detectors and the first and second buffers. The delta T calculation and address generation unit determines the time difference between the peaks received from the peak detectors and uses that time difference to update the addresses of data in one of the buffers, thereby to synchronize the digitized outputs of the first and second analog sensors.

A system according to the present invention may be implemented as a hardwired embodiment, a wireless embodiment, or as a combination hardwired and wireless embodiment. In a hardwired embodiment, the marker may be provided directly from the digital signal generator to the digital-to-analog converters of the analog sensor sub-systems. The outputs of the analog-to-digital converters may be provided directly to the buffers of the synchronization system. In a wireless embodiment, the digital-to-analog converters of the analog sensor sub-systems may be coupled to wireless modules. The wireless modules may contain Radio Frequency (RF) or optical transmitter and/or receiver devices. The marker signal is provided by, or in response to a signal from, a wireless beacon. The buffers of the synchronization system may be coupled to a wireless module.

DETAILED DESCRIPTION

Figure 1:
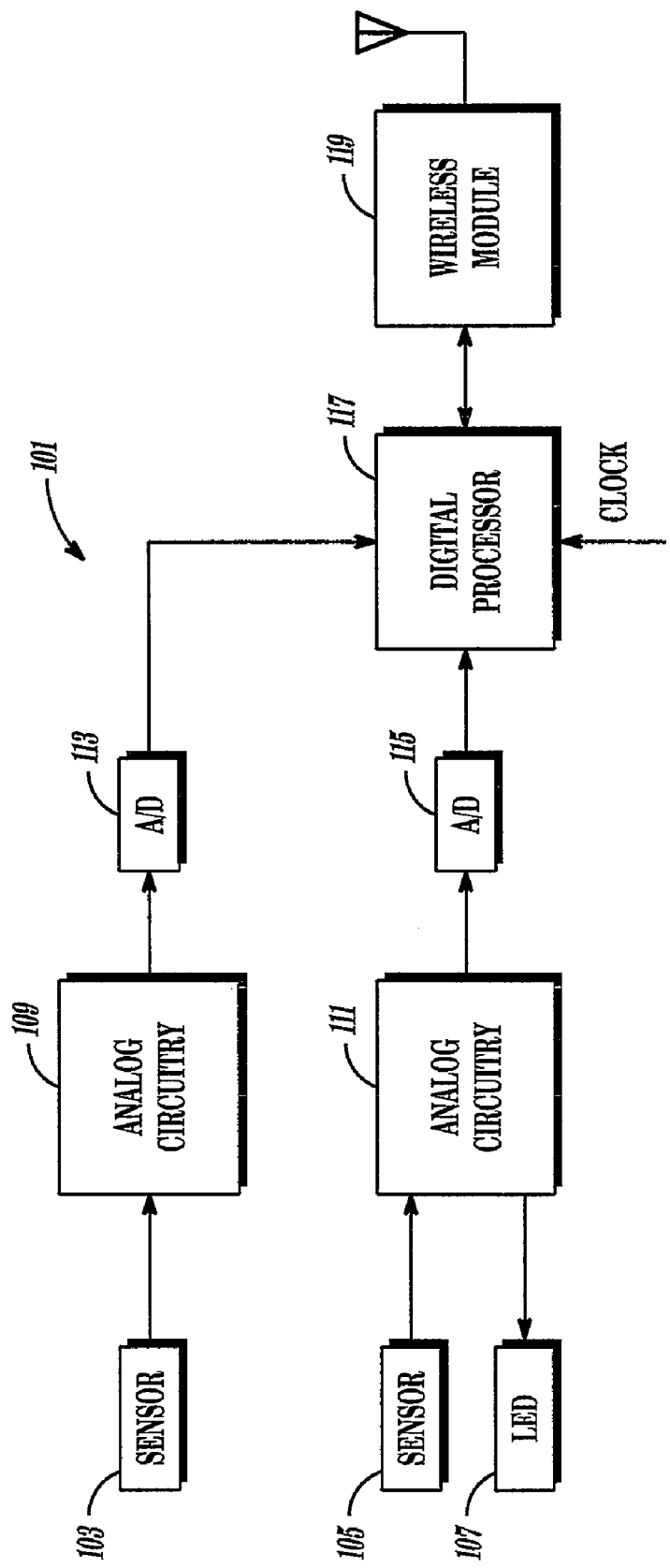
FIG. 1 is a block diagram of a multi-sensor system according to the prior art.

FIG. 1 is a block diagram of a multi-sensor system 101 according to the prior art. System 101 includes a first sensor 103 and a second sensor 105. Sensor 103 may be an accelerometer and sensor 105 may be a photo detector. In the embodiment of FIG. 1, sensor 105 is paired with an LED 107 to form a photoplethysmographic sensor.

Sensor 103 is coupled to analog circuitry 109. Similarly, sensor 105 is coupled to analog circuitry 111. Analog circuitry 109 and 111 includes various components to process and amplify signals received from sensors 103 and 105, respectively. The outputs of analog circuitry 109 and 111 are coupled to analog-to-digital (A/D) converters 113 and 115, respectively. The outputs of A/D converters 113 and 115 are coupled to a digital processor 117. Digital processor 117 may be a digital signal processor (DSP), a field programmable gate array (FPGA), a complex programmable logic device (CPLD), or the like. The output of digital processor 117 may be coupled to a wireless module 119, which may be a radio frequency (RF) or optical device.

Since sensors 103 and 105 are different, the respective circuitries of analog circuitry 109 and 111 are different as well. Accordingly, the processing times for signals received from sensors 103 and 105 are typically different from each other. Accordingly, while the physical events measured by sensors 103 and 105 are synchronized, the outputs of analog circuitry 109 and 111, respectively, typically are not. In order for the results yielded by digital processor 117 to be valid, the outputs of A/D converters 113 and 115 must be synchronized.

Figure 2:
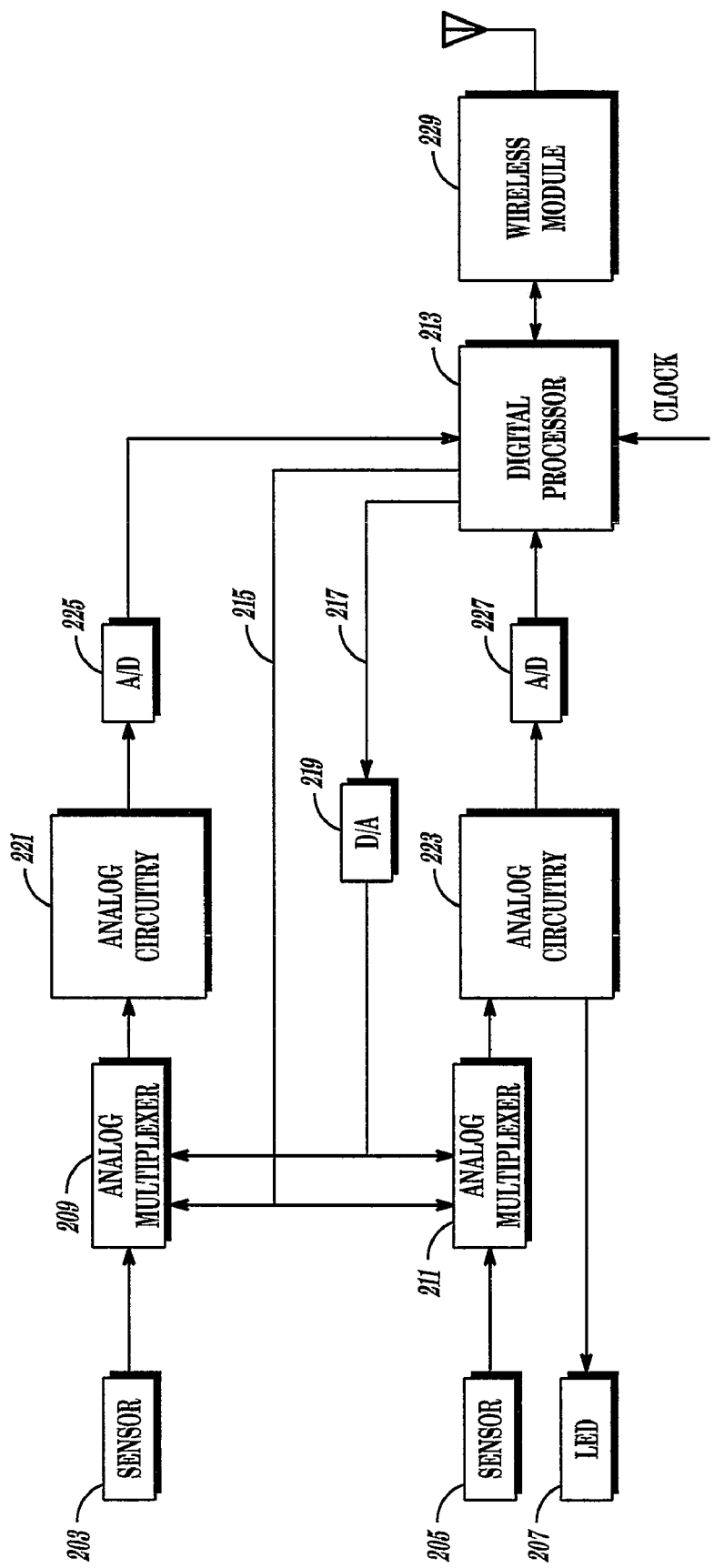
FIG. 2 is a block diagram of an embodiment of a multi-sensor system according to the present invention.

FIG. 2 is a block diagram of an embodiment of a multi-sensor system according to the present invention. System 201 includes a first sensor 203 and a second sensor 205. Sensor 205 is paired with an LED 207. The output of sensor 203 is coupled to an analog multiplexer 209. Similarly, the output of sensor 205 is coupled to an analog multiplexer 211. Analog multiplexers 209 and 211 are coupled to a digital processor 213. Digital processor 213 is programmed to produce a control signal 215 and a digital marker signal 217. Preferably, the digital marker signal is a Barker code or sequence. As is known to those skilled in the art, a Barker code is a sequence of N values of +1 and −1

$a_j$ for j=1, K, N such that $$\left| \sum_{j=1}^{N-\upsilon} a_j a_{j+\upsilon} \right| \leq 1,$$

for all integer values of $\upsilon$, where $1 \leq \upsilon \leq N$.

Preferably, a Barker code of length thirteen is used in the present invention. Digital marker signal 217 is coupled to analog multiplexers 209 and 211 through a digital-to-analog (D/A) converter 219. Thus, according to the present invention, a marker signal is periodically multiplexed with the analog signals from sensors 203 and 205. The marker signals provide a means for synchronizing the signals from sensors 203 and 205. Sensor 203 and/or sensor 205 may be antennas.

Analog multiplexers 209 and 211 are coupled to analog circuitry 221 and 223, respectively. The outputs of analog circuitry 221 and 223 are coupled to A/D converters 225 and 227, respectively. The outputs of A/D converters 225 and 227 are coupled to digital processor 213. The output of digital processor 213 may be coupled to a wireless module 229, so that processed data may be collected remotely.

Figure 3:
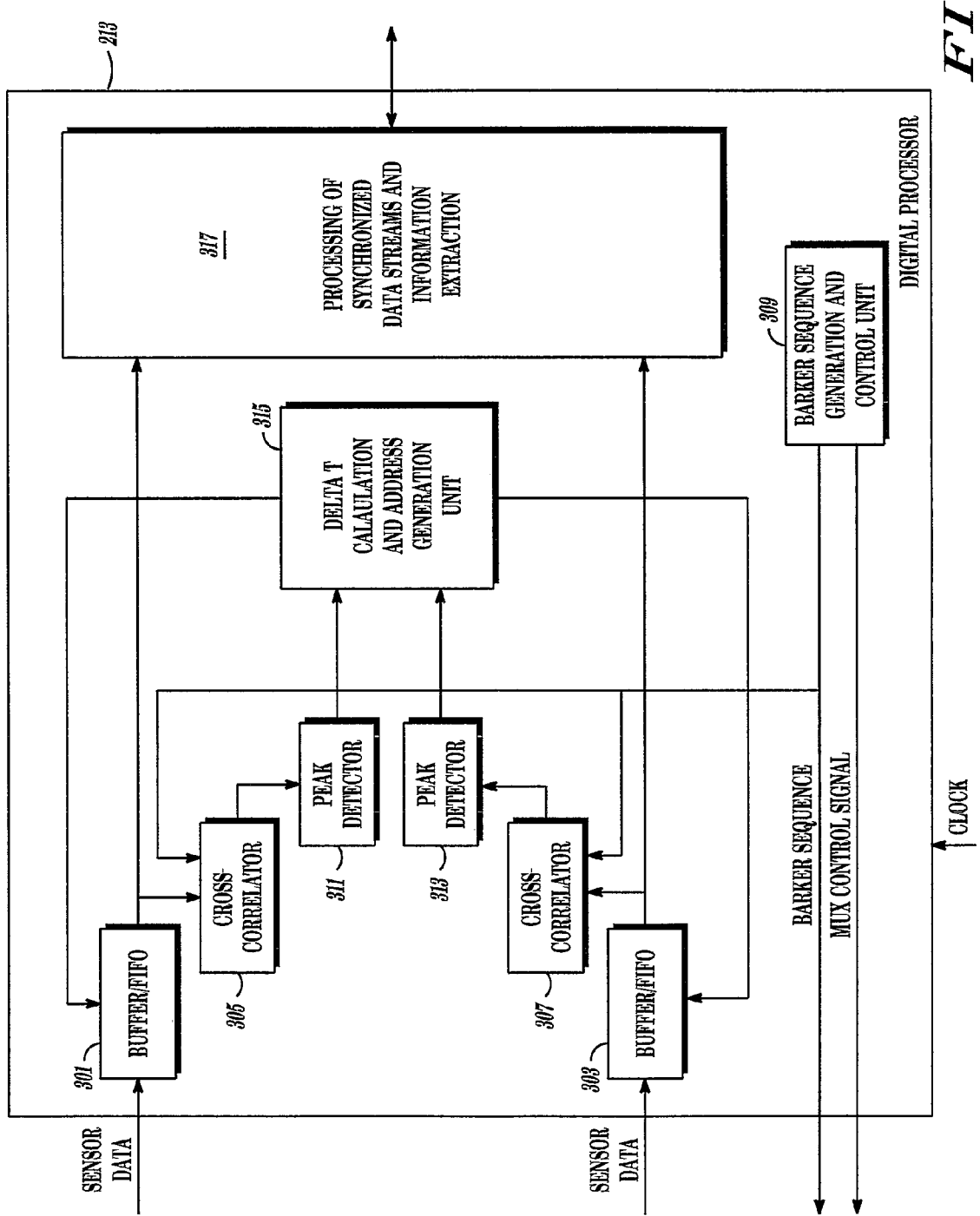
FIG. 3 is a block diagram of an embodiment of a digital processing system according to the present invention.

FIG. 3 is a block diagram of an embodiment of a digital processor 213 according to the present invention. Digital processor 213 may be implemented in a digital signal processor (DSP), a field programmable gate array (FPGA), a complex programmable logic device (CPLD), or the like. Digital processor 213 includes an input buffer 301 that receives digitized sensor data from A/D converter 225 of FIG. 2. Digital processor 213 includes a second input buffer 303 that receives digitized sensor data from A/D converter 227 of FIG. 2. In the embodiment of FIG. 3, input buffers 301 and 303 are first-in-first-out (FIFO) buffers. The output of input buffer 301 is coupled to a cross-correlator 305. Similarly, the output of input buffer 303 is coupled to a cross-correlator 307. Cross-correlators 305 and 307 are also coupled to a Barker sequence generation and control unit 309. Barker sequence generation and control unit supply multiplexer control signal 215 and Barker sequence 217 to analog multiplexers 209 and 211 of FIG. 2.

Cross-correlators 305 and 307 perform cross-correlation, which is a mathematical tool used in signal processing to analyze functions or series of values. Cross-correlation is a measure of the similarity of two signals. It may be thought of as a measure of how well an unknown signal matches a known signal. Thus, cross-correlators 305 and 307 match sensor data, into which has been multiplexed a Barker sequence, with the Barker sequence generated directly by Barker sequence generation and control unit 309.

Cross-correlators 305 and 307 implement the following equation:

$$\Phi_{xy}(d) = \frac{1}{N+1} \sum_{m=0}^{m=N} (x(m) \times y(m+d))$$

where x is the Barker sequence and y is the data coming into the cross-correlator. As the data samples are being read out of buffer 301 or 303, cross-correlator 305 or 307 collects N+1 data samples, where N is the length of the Barker sequence, which in the preferred embodiment is thirteen. Each of the N+1 Barker code points is multiplied by the corresponding N+1 data sample points read from buffer 301 or 303. The products are summed and averaged to obtain a cross-correlation value, which is the output of cross-correlator 305 and 307. As a new sample is read from buffer 301, the oldest cross-correlation value data in cross-correlator 305 is shifted out to a peak detector 311. Similarly, as a new sample is read from buffer 303, the oldest cross-correlation value data in cross-correlator 307 is shifted out to a peak detector 313. It should be apparent to those skilled in the art that cross-correlators 305 and 307 may be replaced by auto-correlators. Autocorrelation is the cross-correlation of a signal with a time shifted version of itself.

Peak detectors 311 and 313 receive cross-correlation value data from cross-correlators 305 and 307, respectively. In the preferred embodiment, peak detectors 311 and 313 each track the last 2(N+1) correlation values received from cross-correlators 305 and 307, respectively. Peak detectors 311 and 313 detect a peak whenever a cross-correlation value exceeds a threshold and a sudden transition occurs. The transition indicates the address at which a Barker code in the sensor data matches the Barker code generated internally by Barker sequence generation and control unit 309. The outputs of peak detectors 311 and 313 are coupled to a delta T calculation and address generation unit 315.

Delta T calculation and address generation unit 315 receives inputs from peak detectors 311 and 313. When delta T calculation and address generation unit 315 receives an input from peak detector 311 or 313, it keeps track of the address location where the peak occurred. Delta T calculation and address generation unit 315 then waits for the other peak detector 311 or 313 to detect a peak. After Delta T calculation and address generation unit 315 has received peak signals from both peak detector 311 and 313, delta T calculation and address generation unit 315 calculates the difference between in the addresses of the peaks. Then, delta T calculation and address generation unit shifts the addresses for the buffers 301 or 303 from which the first peak was detected, thereby synchronizing the outputs of the first 301 and 303. The synchronized outputs of buffers 301 and 303 are coupled to circuitry 317 for processing synchronized data streams and information extraction. The output of circuitry 317 is enhanced sensor data.

Figure 4:
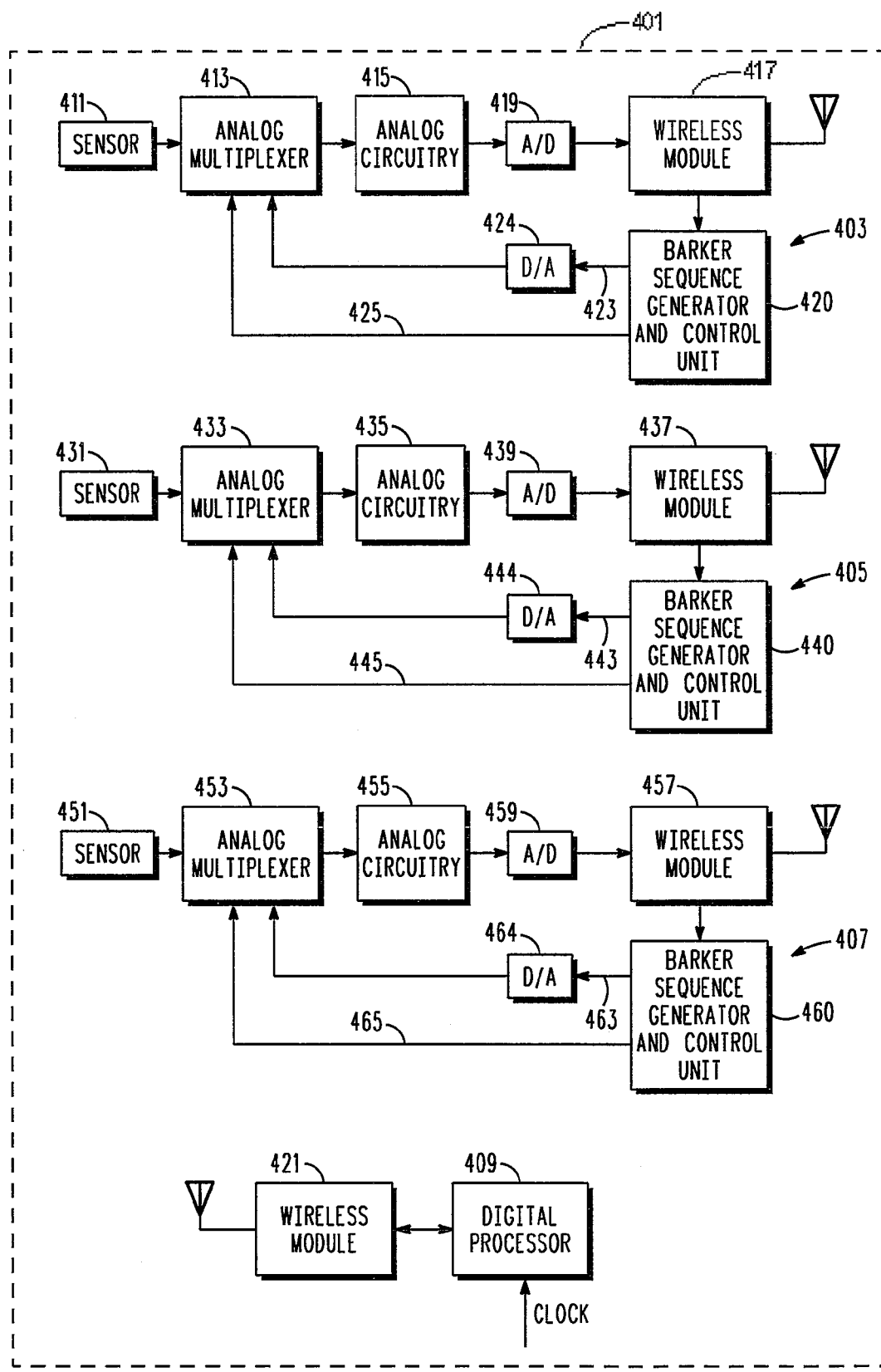
FIG. 4 is a block diagram of an alternative embodiment of a multi-sensor system according to the present invention.

Referring now to FIG. 4, there is illustrated an alternative embodiment of a system 401 according to the present invention. In system 401, a plurality of analog sensor sub-systems 403, 405, and 407, communicate wirelessly with a digital processor 409. Analog sensor sub-system 403 includes an analog sensor 411 that is coupled to an analog multiplexer 413. Analog multiplexer 413 is coupled to analog circuitry 415 which is coupled to a wireless module 417 through an A/D converter 419. Wireless module 417 may be an RF or an optical device. Wireless module 417 that is adapted to send signals to and receive signals from digital processor 409 through a wireless module 421, which may be an RF or an optical device. Wireless module 417 transmits and receives using a multiple access technology such as TDMA. Wireless module 417 is coupled to a Barker sequence generator and control unit 420. As will be explained in detail hereinafter, wireless module 417 receives from wireless module 421 a beacon signal. In response to receipt of the beacon signal, Barker sequence generator and control unit 420 generates a Barker sequence 423 and a control signal 425. Barker sequence generator and control unit 420 provides Barker sequence 423, through a D/A converter 424, and control signal 425 to analog multiplexer 413. Analog sensor sub-system 403 operates substantially in the manner described with respect to FIG. 2 except that the digitized output of analog sensor 411 is coupled wirelessly to digital processor 409 rather than by hardwire.

Analog sensor sub-systems 405 and 407 are similar to analog sensor sub-system 403. Analog sensor sub-system 405 includes an analog sensor 431 that is coupled to an analog multiplexer 433. Analog multiplexer 433 is coupled to analog circuitry 455 which is coupled to a wireless module 437 through an A/D converter 439. Wireless module 437 is adapted to send signals to and receive signals from digital processor 409 through wireless module 421. Wireless module 437 transmits and receives using a multiple access technology such as TDMA. Wireless module 437 is coupled to a Barker sequence generator and control unit 440. Wireless module 437 receives from wireless module 421 a beacon signal. Barker sequence generator and control unit 440 generates a Barker sequence 443 and a control signal 445 in response to receipt of the control signal. Barker sequence generator and control unit 440 provides Barker sequence 443, through a D/A converter 444, and control signal 445 to analog multiplexer 433. Similarly, analog sensor sub-system 407 includes an analog sensor 451 that is coupled to an analog multiplexer 453. Analog multiplexer 453 is coupled to analog circuitry 455, which is coupled to a wireless module 457 through an A/D converter 459. Wireless module 457 is adapted to send signals to and receive signals from digital processor 409 through wireless module 421. Wireless module 457 transmits and receives using a multiple access technology such as TDMA. Wireless module 457 is coupled to a Barker sequence generator and control unit 460. Wireless module 457 receives from wireless module 421 a beacon signal. Barker sequence generator and control unit 460 generates a Barker sequence 463 and a control signal 465 in response to receipt of the control signal. Barker sequence generator and control unit 440 provides Barker sequence 463, through a D/A converter 464, and control signal 445 to analog multiplexer 453. It should be recognized that wireless modules according to embodiments of the present invention may be RF or optical devices.

Figure 5:
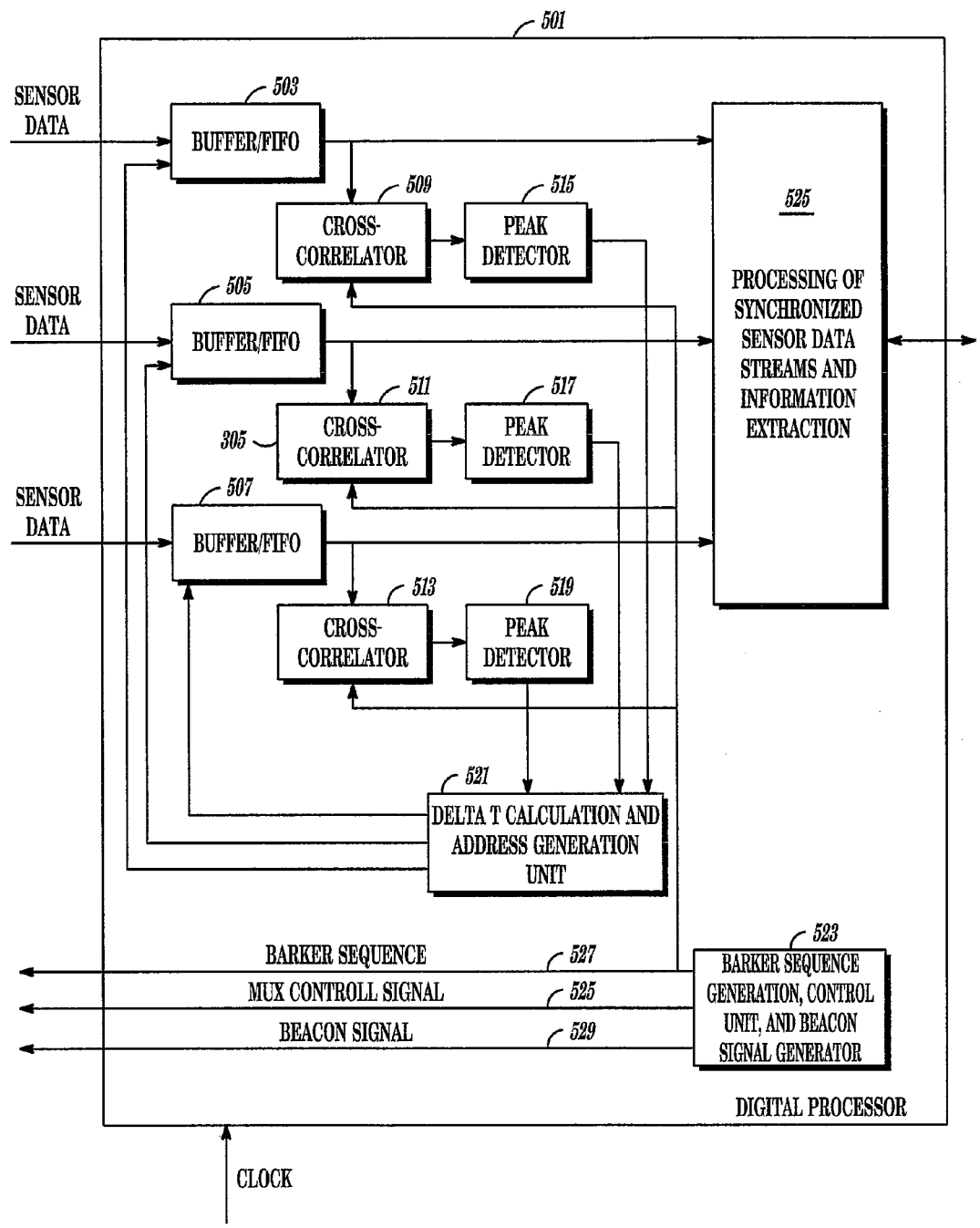
FIG. 5 is a block diagram of an alternative embodiment of a digital processing system according to the present invention.

Referring now to FIG. 5, there is illustrated a digital processor 501 according to an alternative embodiment of the present invention. Digital processor 501 may be implemented in a digital signal processor (DSP), a field programmable gate array (FPGA), a complex programmable logic device (CPLD), or the like. Digital processor 501 may be used as an implementation of digital processor 409 of FIG. 4. Digital processor 501 includes a plurality of input buffers 503, 505, and 507. Buffers 503, 505, and 507 receive sensor data either wirelessly, as described with respect to FIG. 4, and as will be described with reference to FIG. 6, or wirelessly and by hardwire, as will be described with reference to FIG. 7.

Buffers 503, 505, and 507 are coupled to cross-correlators 509, 511, and 513, respectively. Cross-correlators 509, 511, and 513 are coupled to a Barker sequence generation, control unit, and beacon or synchronization signal generator 523. Barker sequence generation, control unit, and beacon or synchronization signal generator 523 generates a multiplexer control signal 525, a Barker sequence 527, and a beacon signal 529. Beacon signal 529 may be coupled to a wireless module, such as wireless module 421 of FIG. 4. Wireless module 421 acts as a beacon to broadcast beacon signal 529 simultaneously to analog sensor sub-systems 403, 405, and 407 of FIG. 4. Wireless sensor sub-systems, such as sub-systems 403, 405, and 407 generate Barker sequences and multiplexer control signals in response to receiving the beacon signal. Barker sequence 529 is coupled to cross-correlators 509, 511, and 513. Multiplexer control signal 525 and Barker sequence 527 may be coupled by hard wire to analog multiplexers as described for example in connection with FIG. 7, below.

Cross-correlators 509, 511, and 513 are coupled to peak detectors 515, 517, and 519, respectively. Peak detectors 515, 517, and 519 are coupled to a delta T calculation and address generation unit 521. Delta T calculation and address generation unit 521 is coupled to buffers 503, 505, and 507. Cross-correlators 503, 505, and 507, peak detectors 515, 517, and 519, and delta T calculation and address generation unit 521 operate in the manner describe above with reference to FIG. 3 to synchronize the outputs of buffers 503, 505, and 507. The synchronized outputs of buffers 503, 505, and 507 are coupled to circuitry 525, which processes the synchronized sensor data streams and extracts information.

Figure 6:
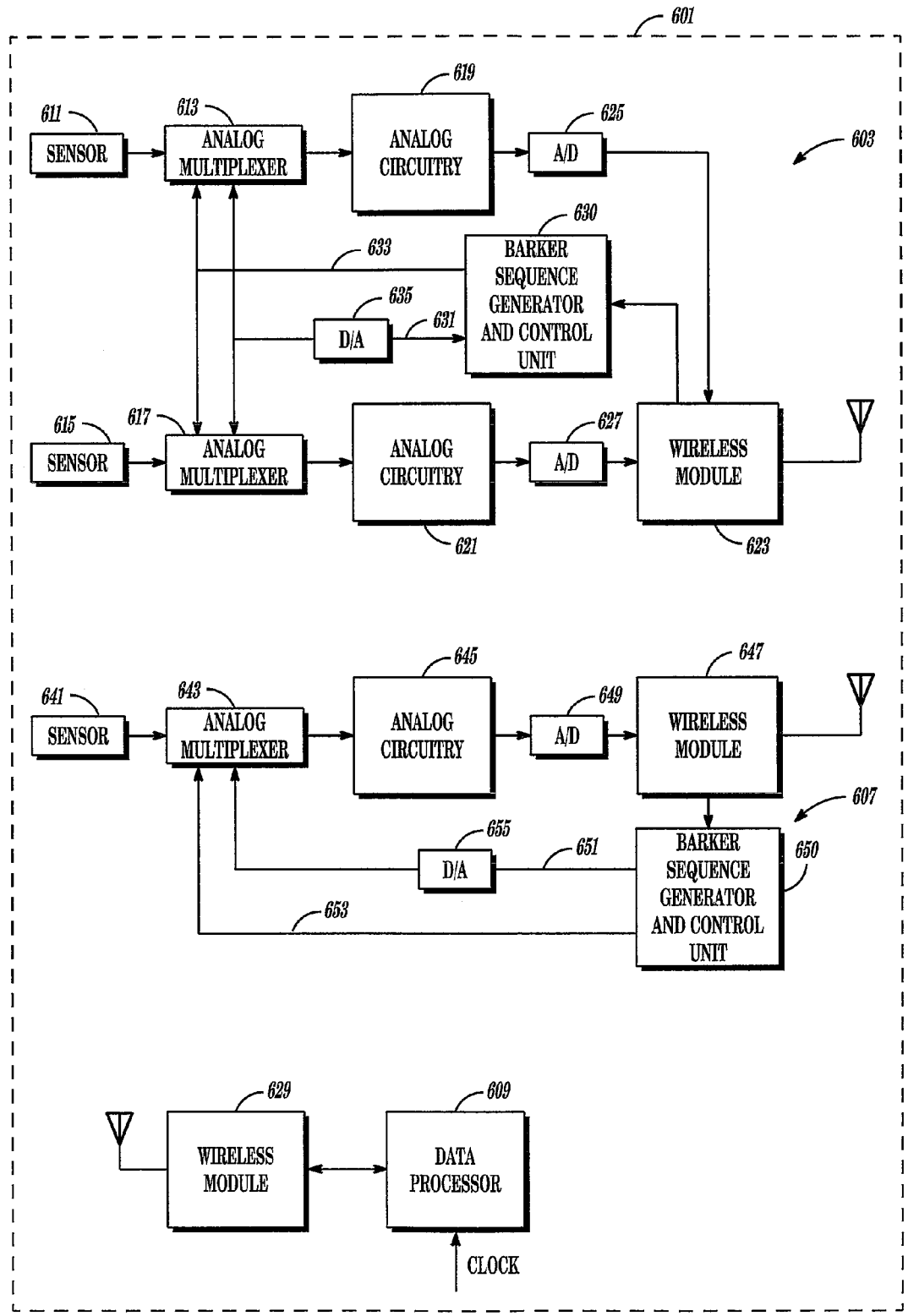
FIG. 6 is a block diagram of a further alternative embodiment of a multi-sensor system according to the present invention.

Referring now to FIG. 6, there is illustrated a further alternative embodiment of a system 601 according to the present invention. In system 601, a plurality of analog sensor sub-systems 603 and 607 communicate wirelessly with a digital processor 609. Analog sensor sub-system 603 is similar to the analog sensor sub-system of FIG. 2, in that it includes an analog sensor 611, coupled to an analog multiplexer 613, and an analog sensor 615, coupled to an analog multiplexer 617. Analog multiplexers 613 and 617 are coupled to analog circuitry 619 and 621, respectively, which are coupled to a wireless module 623 through A/D converters 625 and 627, respectively. Wireless module 623 that is adapted to send signals to and receive signals from a digital processor 609 through a wireless module 629. Wireless module 623 transmits using a multiple access technology such as TDMA. Wireless module 623 is coupled to a Barker sequence generator and control unit 630. Wireless module 623 receives from wireless module 629 a beacon signal. Barker sequence generator and control unit 630 generates a Barker sequence 631 and a control signal 633 in response to receipt of the beacon signal. Barker sequence generator and control unit 630 provides Barker sequence 631, through a D/A converter 635, and control signal 633 to analog multiplexers 613 and 617. Analog sensor sub-system 603 operates substantially in the manner described with respect to FIG. 2 except that the digitized outputs of analog sensors 611 and 615 are coupled wirelessly to digital processor 609 rather than by hardwire.

Analog sensor sub-system 607 includes an analog sensor 641 that is coupled to an analog multiplexer 643. Analog multiplexer 643 is coupled to analog circuitry 645, which is coupled to a wireless module 647 through an A/D converter 649. Wireless module 647 that is adapted to send signals to and receive signals from digital processor 609 through wireless module 629. Wireless module 647 transmits and receives using a multiple access technology such as TDMA. Wireless module 647 is coupled to a Barker sequence generator and control unit 650. Wireless module 647 receives from wireless module 629 a beacon signal. Barker sequence generator and control unit 650 generates a Barker sequence 651 and a control signal 653 in response to receipt of the beacon signal.

Barker sequence generator and control unit 650 provides Barker sequence 651, through a D/A converter 655, and control signal 653 to analog multiplexer 643. Analog sensor sub-system 607 operates substantially in the same manner as analog sensor sub-systems 403, 405, and 407 of FIG. 4.

Figure 7:
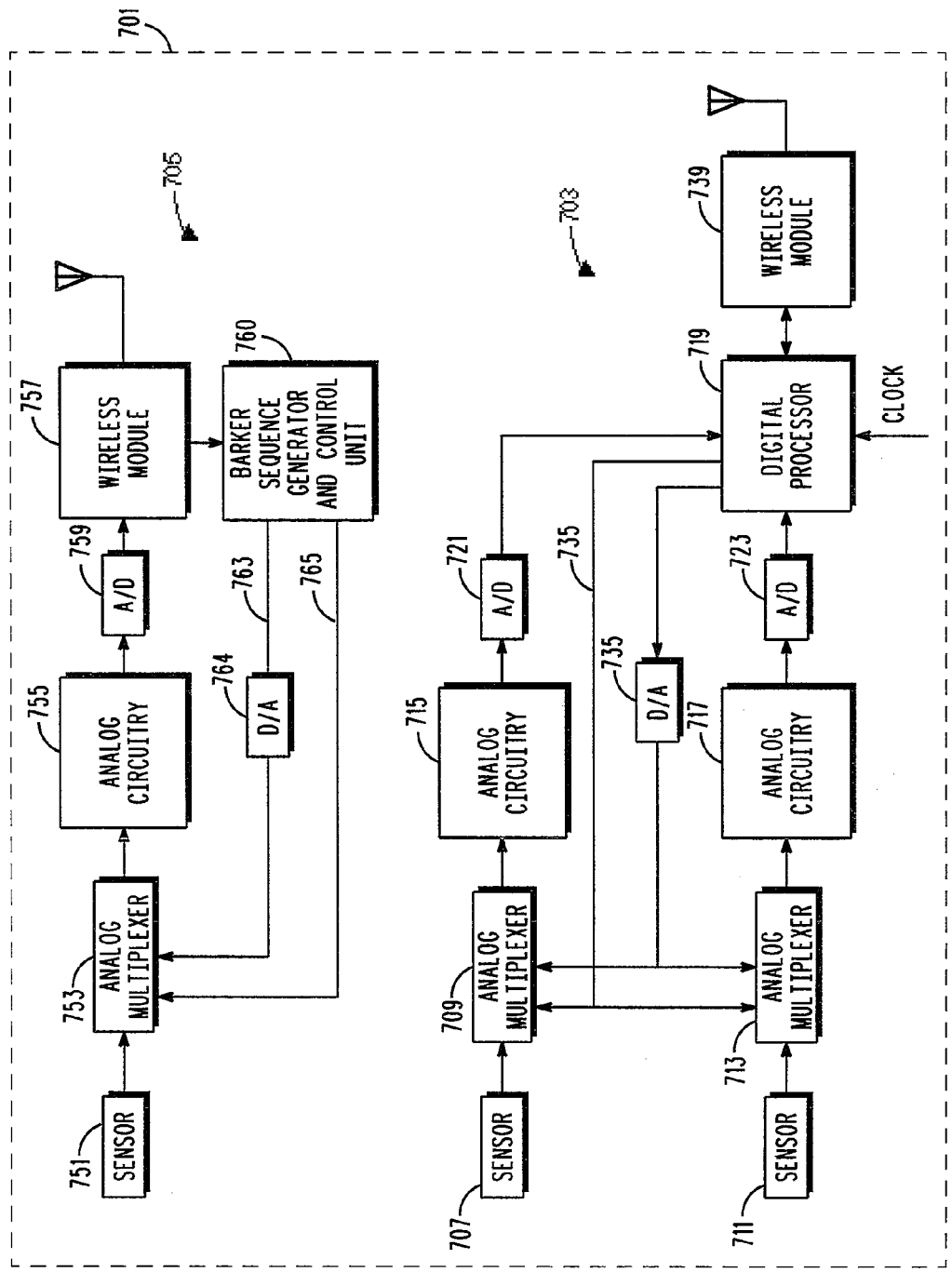
FIG. 7 is a block diagram of a further alternative embodiment of a multi-sensor system according to the present invention.

FIG. 7 illustrates a combination wireless and hardwired embodiment of a system 701 according to the present invention. System 701 includes a hardwired system 703, similar to system 201 of FIG. 2, and a wireless sub-system 705, similar to systems 403, 405, and 407 of FIG. 4. System 703 includes an analog sensor 707, coupled to an analog multiplexer 709, and an analog sensor 711, coupled to an analog multiplexer 713. Analog multiplexers 709 and 713 are coupled to analog circuitry 715 and 717, respectively, which are coupled to a digital processor 719 through A/D converters 721 and 723, respectively. Digital processor 719 may be implemented in manner described with reference to FIG. 5, except that the digitized outputs of sensors 707 and 709 are hardwired to digital processor 719, and Barker sequence 731 and control signal 733 are hardwired to analog multiplexers 709 and 713. Barker sequence 731 is coupled to analog multiplexers 709 and 713 through D/A converter 735. Digital processor 719 is coupled to a wireless module 739 to transmit data extracted by digital processor 719, as described with reference to FIGS. 3 and 5. Wireless module 739 also receives digitized sensor data from, and transmits beacon signals to, system 705. The timing of the beacon signal may be adjusted to account for delays in transmission to Barker sequence generator 760 through wireless modules 739 and 757 so that the Barker sequences are received simultaneously at analog multiplexers 709, 713, and 753.

Analog sensor sub-system 705 is similar to analog sensor sub-systems 403, 405, and 407 of FIG. 4. Analog sensor sub-system 705 includes an analog sensor 751 that is coupled to an analog multiplexer 753. Analog multiplexer 753 is coupled to analog circuitry 755, which is coupled to a wireless module 757 through an A/D converter 759. Wireless module 757 that is adapted to send data signals to, and receive beacon signals from, digital processor 719 through wireless module 739. Wireless module 757 is coupled to a Barker sequence generator and control unit 760. Wireless module 757 receives from wireless module 739 beacon signals. Barker sequence generator and control unit 760 generates a Barker sequence 763 and a control signal 765 in response to receipt of beacon signal. Barker sequence generator and control unit 760 provides Barker sequence 763, through a D/A converter 764, and control signal 765 to analog multiplexer 753.

It is expected that one of ordinary skill, notwithstanding possibly significant effort and many design choices motivated by, for example, available time, current technology, and economic considerations, when guided by the concepts and principles disclosed herein will be readily capable of generating similar effects with minimal experimentation. It will be appreciated that embodiments of the invention described herein may be comprised of one or more conventional processors and unique stored program instructions that control the one or more processors to implement, in conjunction with certain non-processor circuits, some, most, or all of the functions described herein. The non-processor circuits may include, but are not limited to, a sensor, a wireless receiver, a wireless transmitter, signal drivers, clock circuits, power source circuits, and user input devices.

Furthermore, although the invention is described with data coming directly from sensors and output transmitted wirelessly to another system, the input data can come from other remote systems through antennas for example, and the output can be consumed by a sub-system module such as a second circuit within the same electronic system board.

From the foregoing, it may be seen that embodiments of the present invention are well adapted to overcome the shortcomings of the prior art. The present invention has been described with reference to presently preferred embodiments. Those skilled in the art, given the benefit of the foregoing description, will recognize alternative embodiments. Accordingly, the foregoing description is intended to be used for purposes of illustration and not of limitation.

What is claimed is:

1. A multi-sensor system, which comprises:
   a first analog sub-system, said first analog sub-system including a first analog sensor, said first analog sensor producing an output, and first analog circuitry coupled to said first analog sensor, said first analog circuitry processing said output from said first analog sensor;
   a second analog sub-system, said second analog sub-system including a second analog sensor, said second analog sensor producing an output, and second analog circuitry coupled to said second analog sensor, said first analog circuitry processing said output from said second analog sensor; and,
   means for synchronizing the outputs of said first and second analog circuitry, wherein said means for synchronizing the outputs of said first and second analog circuitry comprises;
   a first analog multiplexer coupled between said first analog sensor and said first analog circuitry;
   a second analog multiplexer coupled between said second analog sensor and said second analog circuitry; and,
   a marker signal generator coupled to said first and second analog multiplexers.

2. The system as claimed in claim 1, wherein said marker signal generator comprises:
   a digital signal generator; and,
   a digital-to-analog converter coupled between said digital signal generator and said analog multiplexers.

3. The system as claimed in claim 2, wherein said digital signal generator comprises:
   a Barker sequence generator.

4. The system as claimed in claim 1, including:
   a first analog-to-digital converter coupled to the output of said first analog circuitry; and,
   a second analog-to-digital converter coupled to the output of said second analog circuitry.

5. The system as claimed in claim 4, wherein said means for synchronizing the outputs of said first and second analog circuitry comprises:
   a first buffer coupled to said first analog-to-digital converter;
   a second buffer coupled to said second analog-to-digital converter;
   a first correlation device coupled to said first buffer; and,
   a second correlation device coupled to said second buffer.

6. The system as claimed in claim 5, wherein said means for synchronizing the outputs of said first and second analog circuitry based upon said marker further comprises:
   a first peak detector coupled to said first correlation device;
   a second peak detector coupled to said second correlation device; and,
   an address generation unit coupled to said first and second peak detectors and to said first and second buffers.

7. The system as claimed in claim 4, wherein:
   said first analog-to-digital converter is coupled to the output of said first analog circuitry through a first wireless link; and, said second analog-to-digital converter is coupled to the output of said second analog circuitry through a second wireless link.

8. The system as claimed in claim 1, wherein said means for synchronizing the outputs of said first and second analog circuitry comprises:
a beacon coupled to said first and second sensor sub-systems through wireless links.

9. The system as claimed in claim 4, wherein said means for synchronizing the outputs of said first and second analog circuitry further comprises:
means for detecting said marker signal in the output of said first analog-to-digital converter; and
means for detecting said marker signal in the output of said second analog-to-digital converter.

10. The system as claimed in claim 9, wherein said means for detecting said marker signals in the outputs of said first and second analog-to-digital converter comprises:
a first correlation device coupled to the output of said first analog-to-digital converter;
a first peak detector coupled to said first correlation device;
a second correlation device coupled to the output of said second analog-to-digital converter; and,
a second peak detector coupled to said second correlation device.

11. The system as claimed in claim 10, wherein said first and second correlation devices each comprise a cross-correlator.

12. The system as claimed in claim 9, wherein said means for synchronizing the outputs of said first and second analog circuitry further comprises:
means for synchronizing said marker signal detected in the output of said first analog-to-digital converter with said marker signal detected in the output of said second analog-to-digital converter.

13. The system as claimed in claim 10, wherein said means for synchronizing the outputs of said first and second analog circuitry further comprises:
a first buffer coupled to the output of said first analog-to-digital converter;
a second buffer coupled to the output of said second analog-to-digital converter; and,
said means for synchronizing said marker signal detected in the output of said first analog-to-digital converter with said marker signal detected in the output of said second analog-to-digital converter includes means for shifting data in one of said buffers.

14. The system as claimed in claim 13, wherein said means for shifting data in one of said buffers comprises an address generation unit coupled to said one of said buffers.

15. The system as claimed in claim 13, wherein said means for synchronizing the outputs of said first and second analog circuitry further comprises:
a first correlation device coupled to said first buffer;
a second correlation device coupled to said second buffer; and,
a first peak detector coupled to said first correlation device;
a second peak detector coupled to said second correlation device; and,
said means for synchronizing said marker signal detected in the output of said first analog-to-digital converter with said marker signal detected in the output of said second analog-to-digital converter includes means for shifting data in one of said buffers comprises means for detecting a time difference between detecting said marker signal in the output of said first analog-to-digital converter and detecting said marker signal in the output of said second analog-to-digital converter.

16. A sensor sub-system, which comprises:
an analog sensor, said analog sensor producing an output;
analog circuitry coupled to said analog sensor, said analog circuitry processing said output from said analog sensor; and,
means for inserting a synchronizing marker into the output of said analog sensor said means for inserting said synchronizing marker into the output of said analog sensor including;
an analog multiplexer coupled between said analog sensor and said analog circuitry;
a digital-to-analog converter coupled to said analog multiplexer; and,
a digital signal generator coupled to said digital-to-analog converter.

17. The sub-system as claimed in claim 16, wherein said digital signal generator comprises:
a Barker sequence generator.

18. The sub-system as claimed in claim 16, wherein said means for inserting said synchronizing marker into the output of said analog sensor comprises:
a wireless module coupled to said digital-to-analog converter.

19. The sub-system as claimed in claim 16, including:
a wireless module coupled to said analog circuitry.

20. The sub-system as claimed in claim 19, including:
an analog-to-digital converter coupled between said analog circuitry and said wireless module.

21. A multi-sensor synchronization system, which comprises:
means for receiving an output signal from a first sensor sub-system, said means for receiving said output signal from said first sensor sub-system including a first input buffer;
means for receiving an output signal from a second sensor sub-system, said means for receiving said output signal from said second sensor including a second input buffer;
a first correlation device coupled to said first input buffer;
a second correlation device coupled to said second input buffer;
a first peak detector coupled to said first correlation device;
a second peak detector coupled to said second correlation device;
an address generation unit coupled to said first and second peak detectors and to said first and second buffers; and,
means for sending a synchronization marker signal to said first and second sensor sub-systems.

22. The system as claimed in claim 21, wherein said means for sending said synchronization marker signal to said first and second sensors comprises:
a synchronization signal generator.

23. The system as claimed in claim 22, wherein said synchronization signal generator comprises:
a Barker sequence generator.

24. The system as claimed in claim 22, wherein said means for sending said synchronization signal to said first and second sensors further comprises:
a wireless module coupled to said synchronization signal generator.

25. The system as claimed in claim 21, wherein said means for receiving said output signal from a first sensor comprises:
a wireless module coupled to said first input buffer.

* * * * *